United States Patent
Luo et al.

(10) Patent No.: US 7,199,654 B1
(45) Date of Patent: Apr. 3, 2007

(54) MULTI-STAGE AMPLIFIER WITH SWITCHING CIRCUITRY

(75) Inventors: Jaifu Luo, Irvine, CA (US); Rajagopal Sundararaman, Mission Viejo, CA (US); Mehmet Ali Tan, Irvine, CA (US)

(73) Assignee: ESS Technology, Inc., Fremont, CA (US)

( * ) Notice: Subject to any disclaimer, the term of this patent is extended or adjusted under 35 U.S.C. 154(b) by 104 days.

(21) Appl. No.: 11/155,296

(22) Filed: Jun. 17, 2005

(51) Int. Cl.
*H03F 1/02* (2006.01)

(52) U.S. Cl. ............................................. 330/9; 330/51
(58) Field of Classification Search .................... 330/9, 330/51, 69, 107, 109; 327/124, 307
See application file for complete search history.

(56) References Cited

U.S. PATENT DOCUMENTS

| | | | |
|---|---|---|---|
| 4,559,502 A | | 12/1985 | Huijsing |
| 4,698,596 A | | 10/1987 | Haigh et al. |
| 5,424,670 A | | 6/1995 | Samuels et al. |
| 6,037,836 A | * | 3/2000 | Yoshizawa ..................... 330/9 |
| 6,191,648 B1 | * | 2/2001 | Lewicki ..................... 327/554 |
| 6,424,208 B1 | | 7/2002 | Pinai |
| 6,768,374 B1 | * | 7/2004 | Lee .................................. 330/9 |

OTHER PUBLICATIONS

Christine K. Eun, Jonathan R. Engbrecht and John W. Liu, "Multistage Op-Amp Design Method for High Bandwidth, Low Supply Voltage Applications",University of Michigan Design 2003, pp. 1-6.

Fan You, Sherif H. K. Embabi and Edgar Sanchez-Sinencio, "Multistage Amplifier Topologies with Nested Gm-C Compensation", IEEE Journal of Solid-State Circuits, vol. 32, No. 12, pp. 2000-2011, Dec. 1997.

Bharath Kumar Thandri and Jose Silva-Martinez, "A Robust Feedforward Compensation Scheme for Multistage Operational Transconductance Amplifiers With No Miller Capacitors", IEEE Journal of Solid-State Circuits, vol. 38, No. 2, pp. 237-243, Feb. 2003.

Thandri et al. "A Robust Feedforward Compensation Scheme for Multistage Operational Transconductance Amplifiers With No Miller Capacitors" IEEE Journal of Solid-State CIrcuits, vol. 38, No. 2, Feb. 2003, pp. 237-243.

Eun et al. "Multistage Op-Amp Design Method for High Bandwidth, Low Supply Voltage Applications" University of Michigan Design Contest 2003, pp. 1-6.

You et al. "Multistage Amplifier Topologies with Nested Gm-C Compensation" IEEE Journal of Solid-State Circuits, vol. 32, No. 12, Dec. 1997, pp. 2000-2011.

* cited by examiner

*Primary Examiner*—Henry Choe
(74) *Attorney, Agent, or Firm*—Kenta Suzue; Haynes Beffel & Wolfeld LLP

(57) ABSTRACT

Disclosed are a multi-stage amplifier circuit, a method of operating a multi-stage amplifier circuit, and a device with the multi-stage amplifier circuit. The amplifier circuit technology includes an operational amplifier shared among multiple stages and switching circuitry. The various switching circuitry switches among elements to provide different input signals and different feedback to the shared operational amplifier at the different stages of operation of the amplifier circuit. The various switching circuitry also stores and discharges charge at one or more operational amplifier inputs.

34 Claims, 14 Drawing Sheets

MULTI-STAGE AMPLIFIER WITH SWITCHING CIRCUITRY

BACKGROUND

1. Field

The technology relates to multi-stage switched capacitors.

2. Description of Related Art

FIGS. 1 and 2 are diagrams of a multi-stage amplifier circuit operating in different stages, the first stage 150 and the second stage 160. Although the boundaries of first stage 150 and the second stage 160 are drawn to exclude the operational amplifier 102 for clarity of distinguishing whether particular circuitry external to the operational amplifier belongs to a particular stage, both the first stage 150 and the second stage 160 actually include the shared operational amplifier 102. Because the different stages share the same operational amplifier, this amplifier design saves cost, area, and power in comparison with a cascaded design that has separate operational amplifiers for different stages of an amplifier circuit.

FIG. 1 is a diagram of a multi-stage amplifier circuit operating in the first stage. The operational amplifier 102 includes a grounded noninverting input 103, an inverting input 104, and an output 105. Switches 121 and 122 are set to provide an input signal for input capacitor $C_{i1}$ 112 to the operational amplifier inverting input 104. Switch 121 is set also to decouple the signal source 110 from the remainder of the amplifier circuit. Switches 136 and 137 are set to provide feedback with feedback capacitor $C_{f1}$ 130 from the operational amplifier output 105 to the inverting input 104. Switches 134 and 135 are set to decouple feedback capacitor $C_{f2}$ 132 from the operational amplifier output 105 and the inverting input 104. Switches 123 and 124 are set to store the output signal of the first stage of the amplifier circuit on input capacitor $C_{i2}$ 114 from the operational amplifier output 105.

FIG. 2 is a diagram of a multi-stage amplifier circuit operating in the second stage. During the first stage of the amplifier circuit, input capacitor $C_{i2}$ 114 stored the output signal from the operational amplifier output 105. Switches 123 and 124 are set to provide this output signal stored on input capacitor $C_{i2}$ 114 as the input signal of the second stage of the amplifier circuit to the operational amplifier inverting input 104. Switches 121 and 122 are set to decouple the input capacitor $C_{i1}$ 112 from the operational amplifier 102. Switches 121 and 122 are set also to couple the input capacitor $C_{i1}$ 112 to the signal source 110 and store the input signal generated by the signal source 110. When the amplifier circuit subsequently operates in the first stage, the input signal stored by the input capacitor $C_{i1}$ 112 will be provided to the operational amplifier inverting input 104. Switches 134 and 135 are set to provide feedback with feedback capacitor $C_{f2}$ 132 from the operational amplifier output 105 to the inverting input 104. Switches 136 and 137 are set to decouple feedback capacitor $C_{f1}$ 130 from the operational amplifier output 105 and the inverting input 104. The output signal at the operational amplifier output 105 during the second stage of the amplifier circuit, is the output signal of the amplifier circuit.

FIGS. 3 and 4 are diagrams of the cascaded equivalent of the multi-stage amplifier of FIGS. 1 and 2. Although the actual implementation of the multi-stage amplifier is not cascaded because multiple stages share the same operational amplifier, the cascaded view provides another point of view of the operation of the multi-stage amplifier. FIG. 3 is a diagram of the cascaded equivalent of the multi-stage amplifier circuit of FIG. 1 operating in the first stage. FIG. 4 is a diagram of the cascaded equivalent of the multi-stage amplifier circuit of FIG. 2 operating in the second stage.

FIG. 5 is a diagram of the multi-stage amplifier circuit showing the parasitic capacitance 170 across the inverting input 104 and noninverting input 103 of the operational amplifier. The parasitic capacitance shown is a symbolic lumped representation of many sources that contribute capacitance, such as capacitance of the interconnects; and gate-to-drain capacitance, gate-to-source capacitance, drain-to-body capacitance, and source-to-body capacitance of the transistor coupled to the node of the operational amplifier input.

This parasitic capacitance is less of an issue in a cascaded implementation that does not share the same operational amplifier, because the stage not presently operating can simply short or otherwise reset the operational amplifier input. However, in multi-stage amplifier circuits that share the same operational amplifier among multiple stages, the operational amplifier may be in continuous or near-continuous use, denying any opportunity to short or otherwise reset the operational amplifier input. As a result, the parasitic capacitance can build up undesired charge during operation of the amplifier circuit, distorting the output of the amplifier circuit. Accordingly, it would be desirable to operate a multi-stage amplifier sharing the operational amplifier among multiple stages, without suffering the penalties of parasitic capacitance caused by the shared operational amplifier architecture.

SUMMARY

Various embodiments of the technology relate to a multi-stage amplifier circuit. One embodiment is a multi-stage amplifier circuit with an operational amplifier and multiple switching circuitry elements. The same operational amplifier is used for multiple stages. The operational amplifier has multiple signal inputs, such as an inverting input and a noninverting input, and at least one signal output. The operational amplifier has feedback from the signal output to a signal input. For multiple stages, the multiple switching circuitry elements switch among various elements to provide different input signals and different feedbacks to the operational amplifier. In an exemplary two stage embodiment, the first stage and the second stage can operate at opposite phases of a non-overlapping clock signal.

A first switching circuitry element switches among multiple elements providing input for the operational amplifier. A different input signal is provided to the operational amplifier for different stages of the amplifier circuit. For the first stage of the amplifier circuit, this switching circuitry provides a first signal as signal input to the operational amplifier. For the second stage of the amplifier circuit, this switching circuitry provides a second signal as signal input to the operational amplifier. In one embodiment, the first switching circuitry includes a capacitor receiving an output of the first stage of the amplifier circuit from the output of the operational amplifier, and the capacitor of the first switching circuitry provides the second signal as signal input to the operational amplifier for the second stage of the amplifier circuit.

A second switching circuitry element switches among multiple elements providing the feedback for the operational amplifier. A different feedback is provided to the operational amplifier for different stages of the amplifier circuit. For the first stage of the amplifier circuit, this switching circuitry provides a first capacitive value as the feedback of the operational amplifier. For the second stage of the amplifier circuit, this switching circuitry provides a second capacitive value as the feedback of the operational amplifier.

A third switching circuitry substantially reduces parasitic charge at one or more of the signal inputs of the operational amplifier. For example, the third switching circuitry exchanges charge with at least one of the signal inputs of the operational amplifier. For one of the stages of the amplifier circuit, the third switching circuitry stores charge. For another of the stages of the amplifier circuit, the third switching circuitry discharges the stored charge. One example of the third switching circuitry switches among polarities of a capacitance provided across two of the signal inputs of the operational amplifier, such as the inverting and noninverting inputs. For the first stage of the amplifier circuit, the third switching circuitry provides the capacitance with one polarity. For the second stage of the amplifier circuit, the third switching circuitry provides the capacitance with the opposite polarity.

In some embodiments, the inverting input of the operational amplifier is connected to the first switching circuitry, the second switching circuitry, and the third switching circuitry.

In an exemplary two stage embodiment, operation of the first stage alternates with operation of the second stage. For example, during the first stage of the amplifier circuit, the inverting input is connected to the first signal of the first switching circuitry and the first capacitive value of the second switching circuitry. During the second stage of the amplifier circuit, the inverting input is connected to the second signal of the first switching circuitry and the second capacitive value of the second switching circuitry.

In some embodiments, the result of the amplifier circuit receiving a signal having an out-of-range value as input, is saturation of the output signal provided by the amplifier circuit. By charging and discharging the charge at the operational amplifier input, the output signal substantially recovers from the saturation relatively quickly, for example about a clock cycle after the signal received as input no longer has the out-of-range value. If the amplifier circuit is part of a programmable gain amplifier that processes data from an image sensor array, then about one pixel of data from the image sensor array is improperly processed by the amplifier circuit. In another embodiment, the amplifier circuit is part of a digital to analog converter.

In some embodiments, the amplifier circuit receives input signals from multiple signal sources, such as during the first stage and during the second stage.

In some embodiments, the amplifier circuit is differential.

A method embodiment of the technology includes operating the first stage of the amplifier circuit; operating the second stage of the amplifier circuit; and substantially reducing parasitic charge at one or more of the signal inputs of the operational amplifier. One example of substantially reducing parasitic charge includes: during one of the stages of the amplifier circuit, storing charge from one or more of the signal inputs of the operational amplifier; and during another of the stages of the amplifier circuit, discharging the stored charge to the one or more of the signal inputs of the operational amplifier. During operation of the first stage of the amplifier circuit, a first signal is provided to one of the signal inputs of the operational amplifier, and a first capacitive value is provided as the feedback of the operational amplifier. During operation of the second stage of the amplifier circuit, a second signal is provided to one of the signal inputs of the operational amplifier, and a second capacitive value is provided as the feedback of the operational amplifier.

An image sensing and display device embodiment of the technology includes an amplifier circuit as described herein. The device also includes an image sensor array providing image data to the amplifier circuit, an analog to digital converter receiving amplified image data from the amplifier circuit, image processing circuitry coupled to the analog to digital converter, and a display coupled to the image processing circuitry. Examples of the device are a camera, a phone, and a computer.

DETAILED DESCRIPTION

The technology relates to a multi-stage amplifier that shares an operational amplifier among multiple stages. Embodiments include switching circuitry to substantially reduce parasitic charge at the operational amplifier input stored by the parasitic capacitance.

Figure 6:
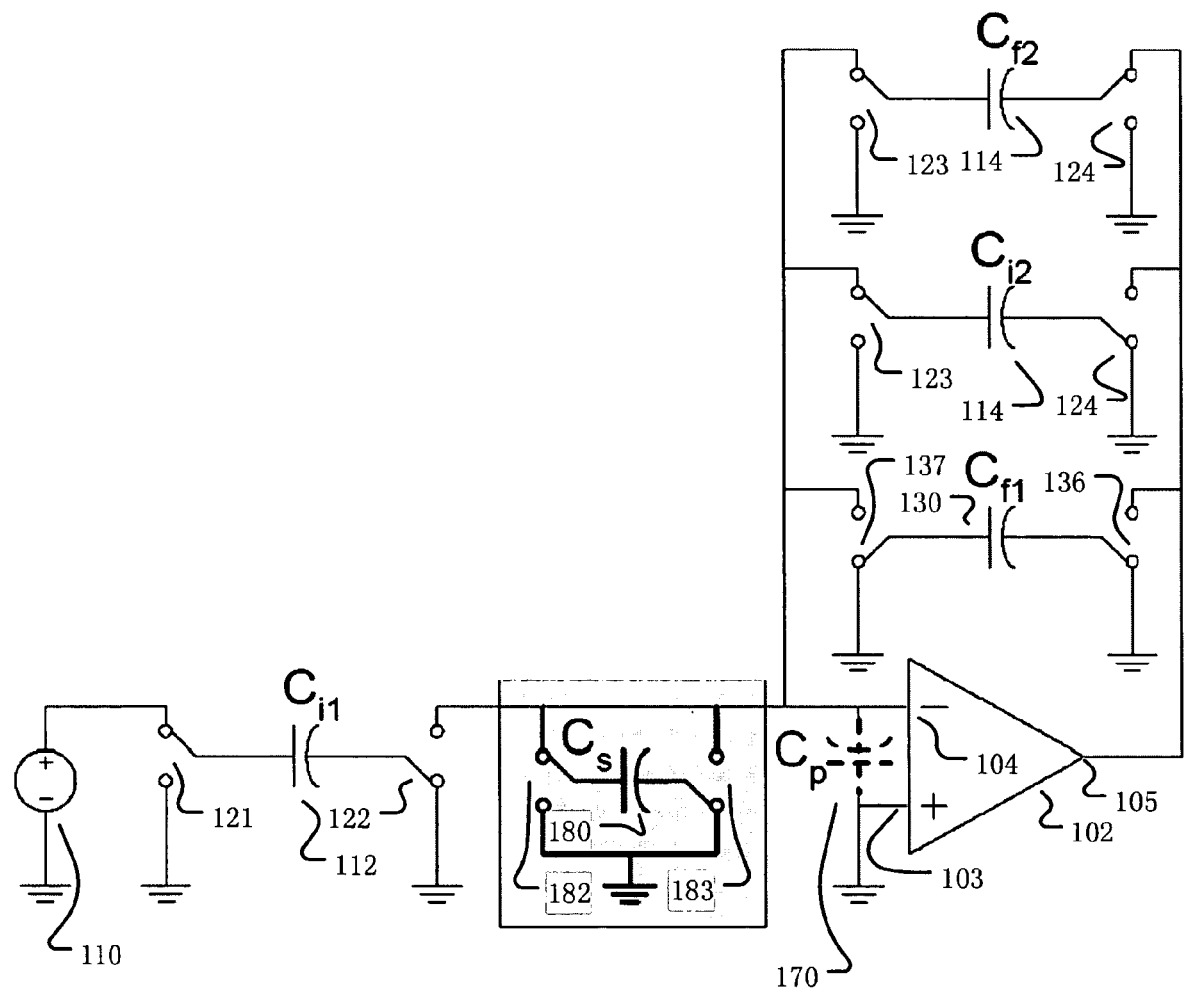
FIG. 6 is a diagram of the multi-stage amplifier circuit showing the parasitic capacitance across inputs of the operational amplifier and switching circuitry that switches polarities of the capacitor coupled to the inverting input of the operational amplifier.

FIG. 6 is a diagram of the multi-stage amplifier circuit showing the parasitic capacitance across inputs of the operational amplifier and switching circuitry that switches polarities of the capacitor coupled to the inverting input of the operational amplifier. Depending on the particular stage of the multi-stage amplifier, switches 182 and 183 change position to change the polarity of the switched capacitor 180 that is coupled to the operational amplifier inverting input. The capacitance value of the switched capacitor 180 is determined empirically via simulation.

Figure 7A:
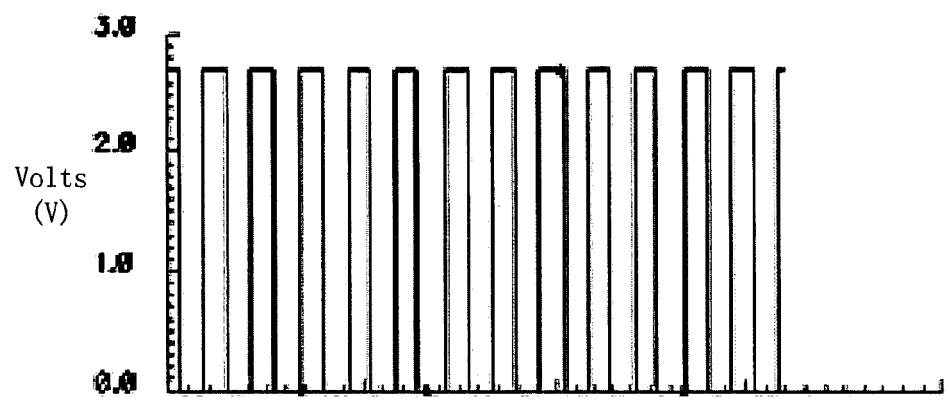
FIGS. 7A, 7B, and 7C show the clock signal, the input signal, and the output signal of the amplifier circuit without the capacitor polarity switching circuitry, where the input signal swings from an out-of-range value to zero.
Figure 7B:
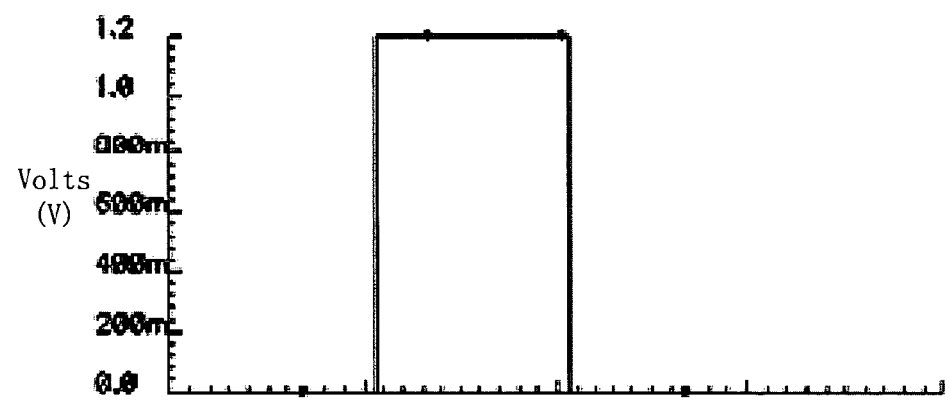
Figure 7C:
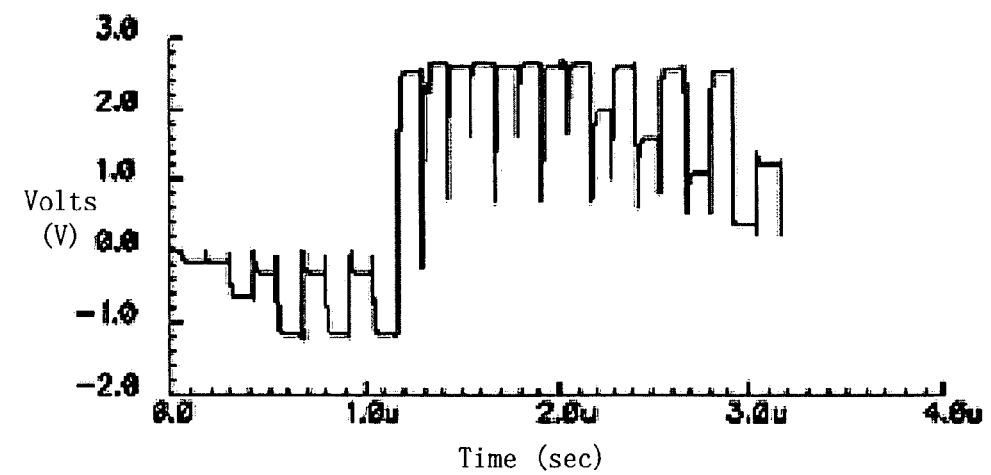

FIGS. 7A, 7B, and 7C show the clock signal, the input signal, and the output signal of the amplifier circuit without the capacitor polarity switching circuitry, where the input signal swings from an out-of-range value to zero. FIG. 7B shows a differential input signal that swings from 0 V to an out-of-range value of 1.2 V, and back to 0 V. FIG. 7C shows that, in response to the input signal with the out-of-range value, the output signal saturates at about 2.8 V. Because of the parasitic charge trapped at the operational amplifier input, even after the input signal no longer has an out-of-range value, even four clock cycles after the input signal returns to an in-range value, the output signal fails to return to normal completely, as shown by the difference between the output signal values before and after the duration of the input signal pulse with the out-of-range value.

Figure 8A:
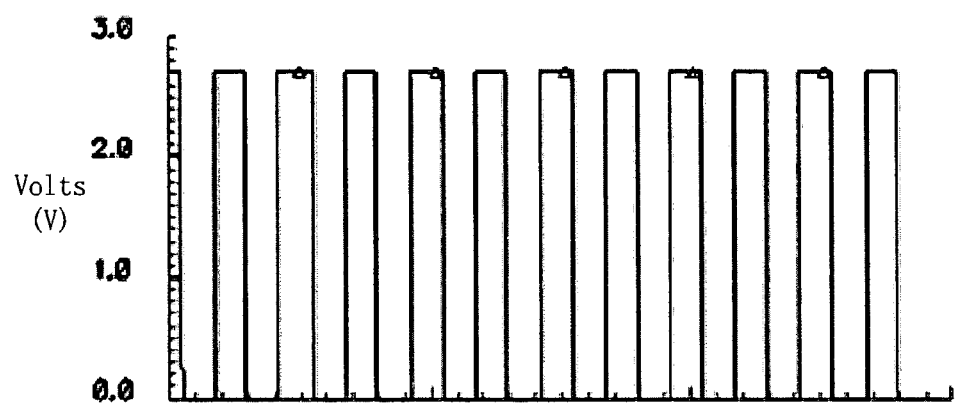
FIGS. 8A, 8B, and 8C show the clock signal, the input signal, and the output signal of the amplifier circuit with the capacitor polarity switching circuitry, where the input signal swings from an out-of-range value to zero.
Figure 8B:
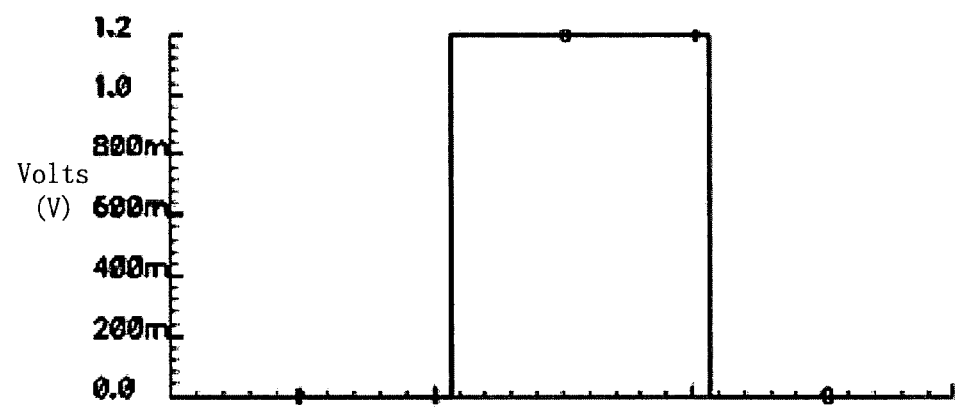
Figure 8C:
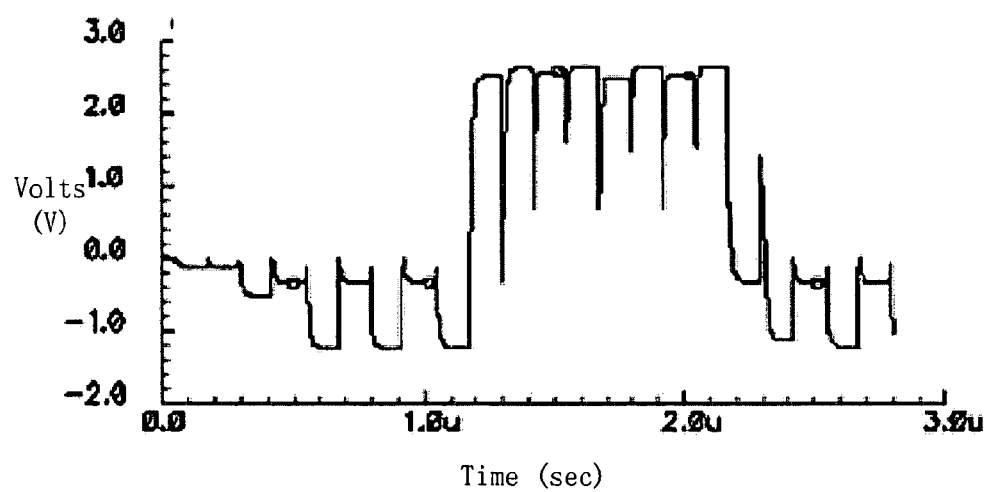

FIGS. 8A, 8B, and 8C show the clock signal, the input signal, and the output signal of the amplifier circuit with the capacitor polarity switching circuitry, where the input signal swings from an out-of-range value to zero. FIG. 8B shows a differential input signal that swings from 0 V to an out-of-range value of 1.2 V, and back to 0 V. In contrast with FIG. 7C, FIG. 8C shows that, a clock cycle after the input signal no longer has an out-of-range value, the output signal returns to normal, as shown by the common appearance of the output signal values before and after the duration of the input signal pulse with the out-of-range value. The capacitor polarity switching circuitry enables much quicker recovery.

Figure 9A:
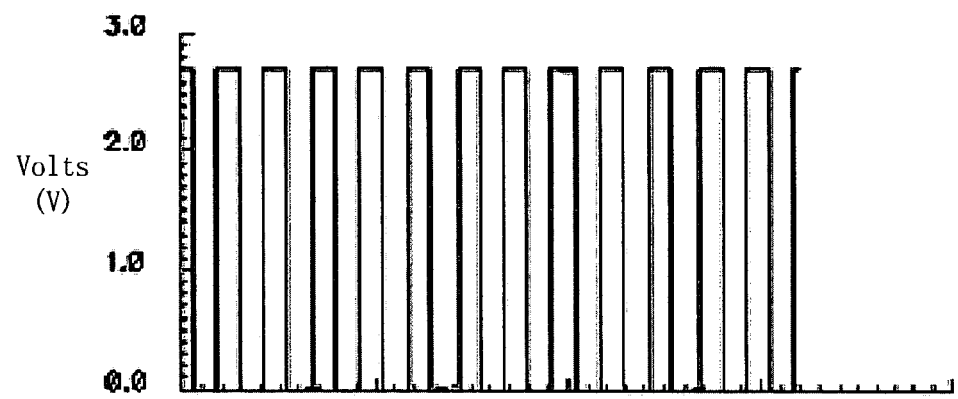
FIGS. 9A, 9B, and 9C show the clock signal, the input signal, and the output signal of the amplifier circuit without the capacitor polarity switching circuitry, where the input signal swings from an out-of-range value to an intermediate value.
Figure 9B:
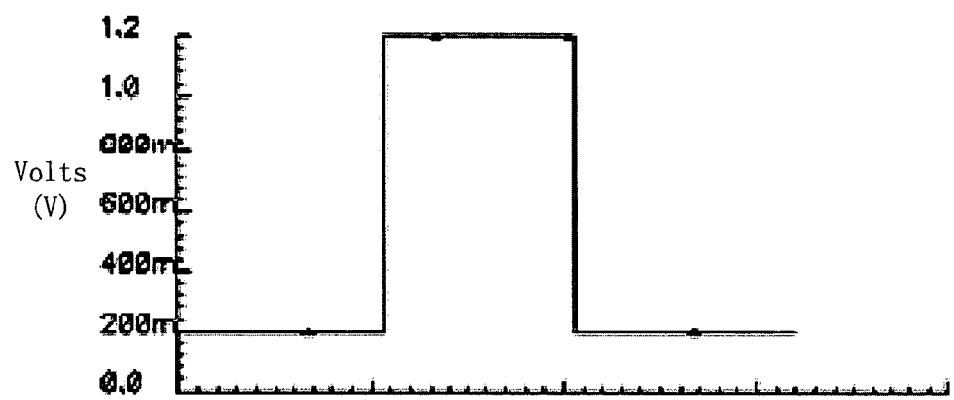
Figure 9C:
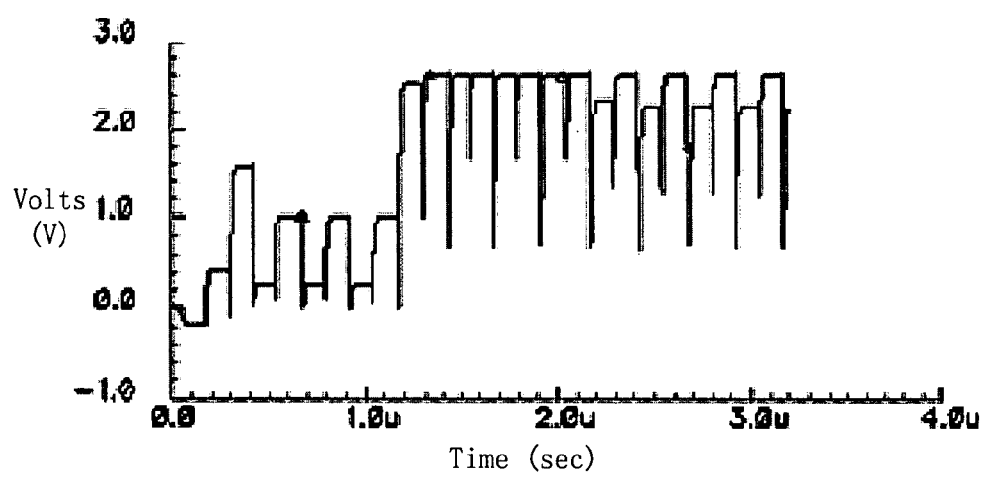

FIGS. 9A, 9B, and 9C show the clock signal, the input signal, and the output signal of the amplifier circuit without the capacitor polarity switching circuitry, where the input signal swings from an out-of-range value to an intermediate value. In contrast with FIGS. 7B and 8B, which showed a differential input signal that swung between 0 V and an out-of-range value, FIG. 9B shows a differential input signal that swings from 0.2 V to an out-of-range value of 1.2 V, and back to 0.2 V. Because the 0.2 V value of the input signal is not sufficiently different from the out-of-range value, the amplifier circuit never has an opportunity to escape the effects of the parasitic charge at the operational amplifier input. Consequently, even four clock cycles after the input signal returns to an in-range value, the output signal shows no sign of even beginning to recover. Unless subsequently the differential input signal takes on a value such as 0 V (c.f. FIGS. 7B and 8B) that is even further away from the out-of-range value, the output signal never recovers from saturation.

Figure 10A:
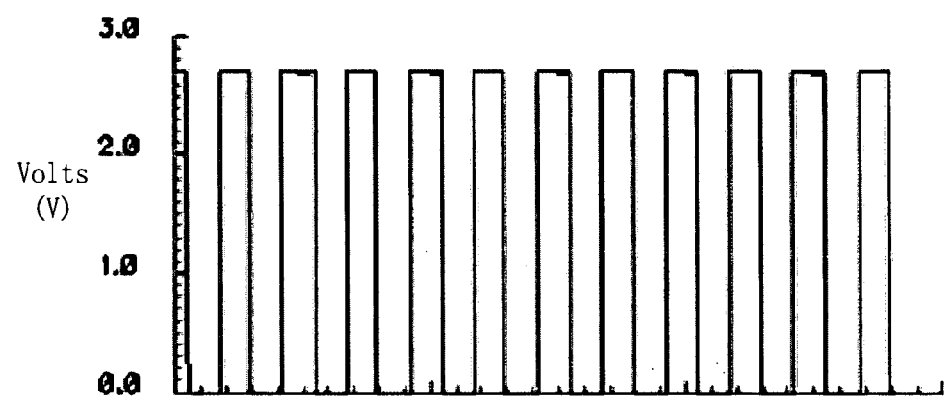
FIGS. 10A, 10B, and 10C show the clock signal, the input signal, and the output signal of the amplifier circuit with the capacitor polarity switching circuitry, where the input signal swings from an out-of-range value to an intermediate value.
Figure 10B:
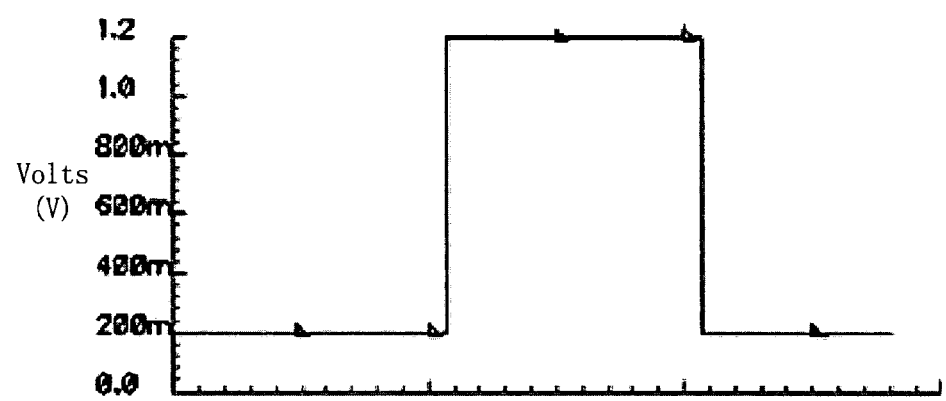
Figure 10C:
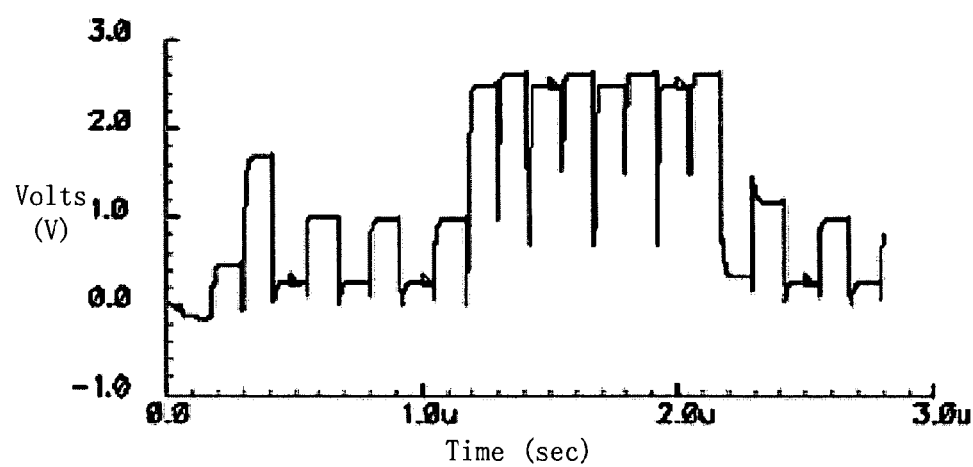

FIGS. 10A, 10B, and 10C show the clock signal, the input signal, and the output signal of the amplifier circuit with the capacitor polarity switching circuitry, where the input signal swings from an out-of-range value to an intermediate value. FIG. 10B also shows a differential input signal that swings from 0.2 V to an out-of-range value of 1.2 V, and back to 0.2 V. In contrast with FIG. 9C, FIG. 10C shows that, a clock cycle after the input signal returns to an in-range value, the output signal has substantially recovered from saturation. Thus, the capacitor polarity switching circuitry is successful at substantially reducing parasitic charge at the operational amplifier input.

Figure 11:
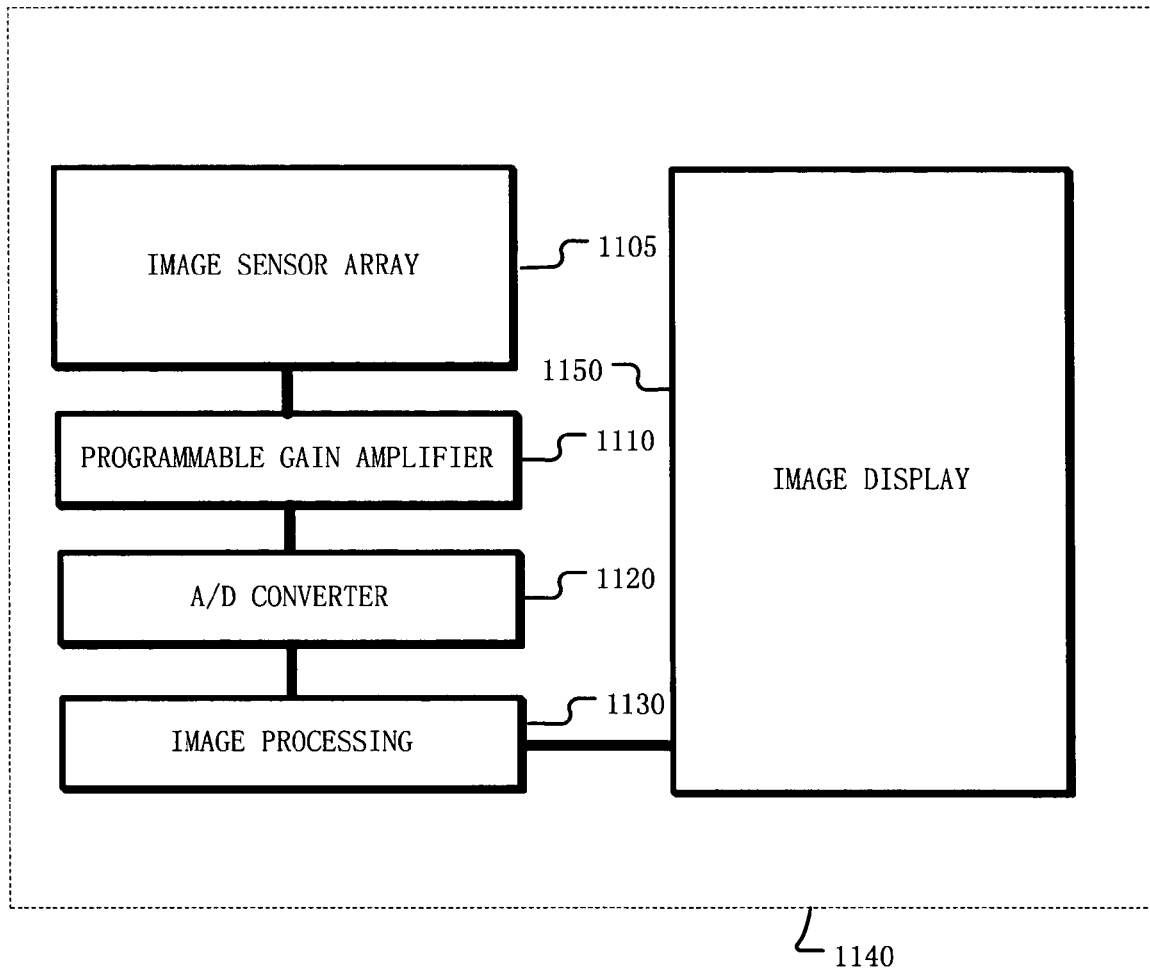
FIG. 11 shows an image sensing and display device with an embodiment of the multi-stage amplifier technology.

FIG. 11 shows an image sensing and display device with an embodiment of the multi-stage amplifier technology. The image sensing and display device 1140 includes an image sensor array 1105, a programmable gain amplifier 1110 with an embodiment of an amplifier circuit, an analog to digital converter 1120, image processing circuitry 1130, and an image display 1150. Examples of an image sensing and display device include a camera, a phone, and a computer.

Other possible implementations replace the capacitor polarity switching circuitry. For example, after the first stage output signal is stored by the input capacitor of the subsequent stage, but prior to coupling the input capacitor of the subsequent stage to the operational amplifier input to provide the input signal for the subsequent stage, the operational amplifier input is shorted or otherwise reset. This approach adds timing circuitry in addition to the clock operating the remainder of the amplifier circuit. In one example, this additional timing circuitry results in shorting the operational amplifier input after decoupling the input capacitor of the subsequent stage from the operational amplifier output of the prior stage, but prior to coupling the input capacitor to the operational amplifier input of the subsequent stage.

Figure 12:
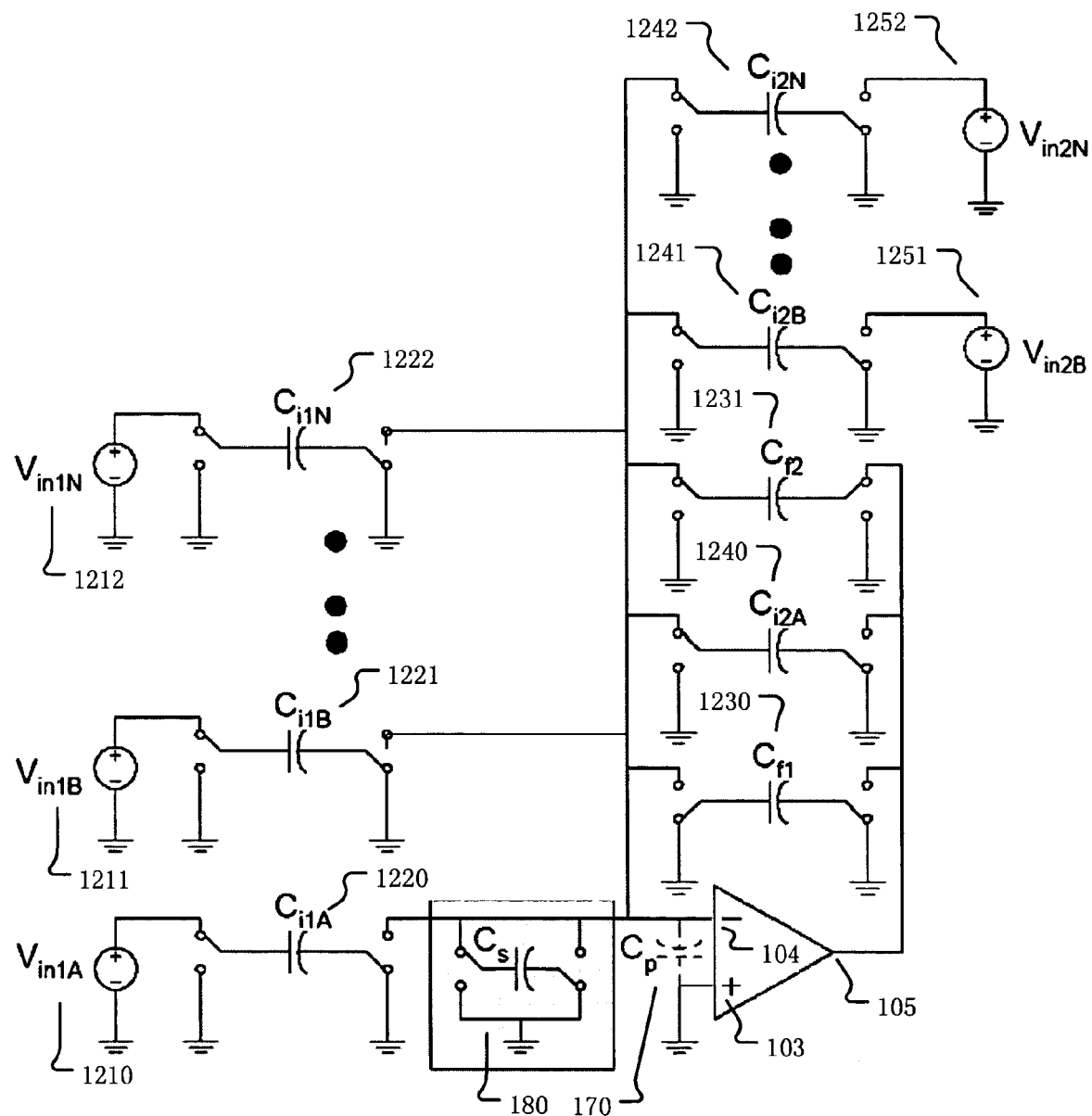
FIG. 12 shows a multi-stage amplifier circuit with multiple inputs to the first stage and multiple inputs to the second stage.

FIG. 12 shows a multi-stage amplifier circuit with multiple inputs to the first stage and multiple inputs to the second stage. Multiple inputs can be used to add or subtract signals, such as dark reference subtraction in image sensors. Thus the multi-stage amplifier circuit of FIG. 12 operates differently from the multi-stage amplifier circuit of FIG. 1 which received input signals from only a single source while operating in the first stage, and differently from the multi-stage amplifier circuit of FIG. 2 which received input signals from only a single source while operating in the second stage. When the multi-stage amplifier circuit of FIG. 12 operates in the first stage, multiple input capacitors $C_{i1A}$ 1220, $C_{i1B}$ 1221, through $C_{i1N}$ 1222 provide multiple input signals to the operational amplifier. The multiple input capacitors $C_{i1A}$ 1220, $C_{i1B}$ 1221, and $C_{i1N}$ 1222 store the input signals generated respectively by $V_{in1A}$ 1210, $V_{in1B}$ 1211, through $V_{in1N}$ 1212 during the second stage of the amplifier circuit. Also during the second stage of the amplifier circuit, multiple input capacitors $C_{i2A}$ 1240, $C_{i2B}$ 1241, and $C_{i2N}$ 1242 provide multiple input signals to the operational amplifier. Note that $C_{i2A}$ 1240 provides the output of the first stage as an input signal. The multiple input capacitors $C_{i2B}$ 1241 through $C_{i2N}$ 1242 store the input signals generated respectively by $V_{in2B}$ 1251 through $V_{in2N}$ 1252 during the first stage of the amplifier circuit.

Figure 13A:
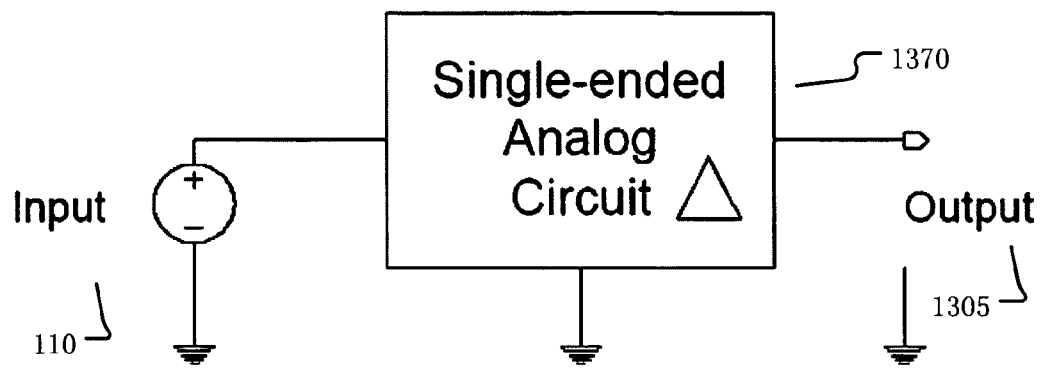
FIGS. 13A and 13B contrast a single-ended implementation of the multi-stage amplifier circuit with a differential implementation of the multi-stage amplifier circuit.
Figure 13B:
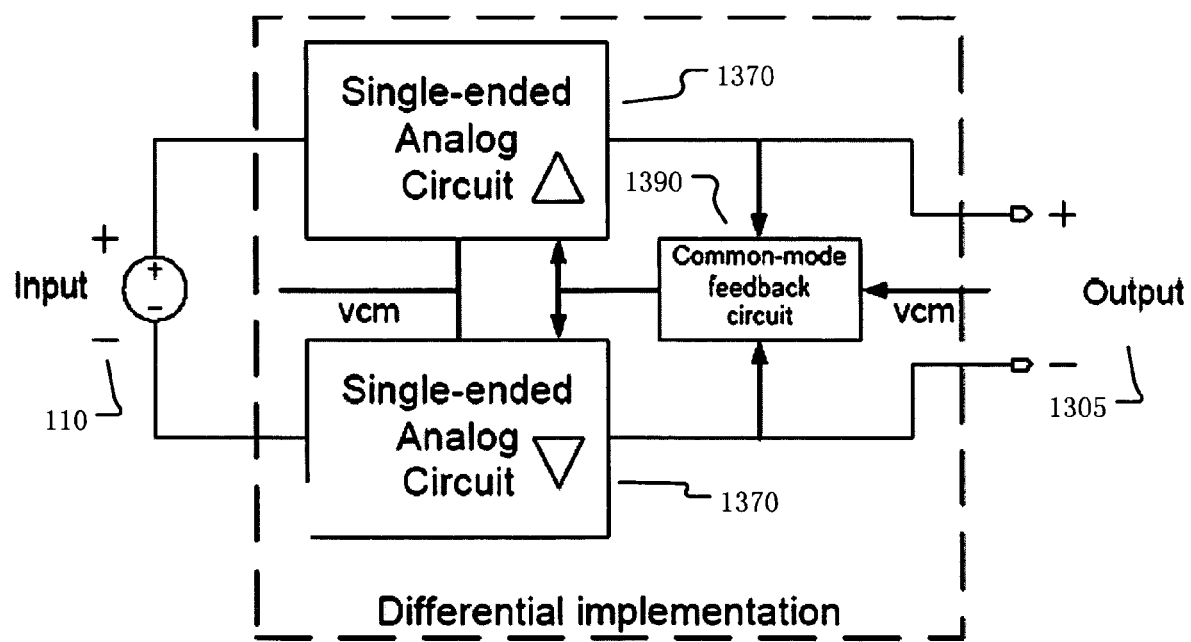

FIGS. 13A and 13B contrast a single-ended implementation of the multi-stage amplifier circuit with a differential implementation of the multi-stage amplifier circuit. FIG. 13A schematically shows a single-ended analog circuit, such as the multi-stage amplifier circuit of FIGS. 6 and 12. FIG. 13B schematically shows a differential implementation, such as the multi-stage amplifier circuit of FIGS. 6 and 12. FIG. 13B contains substantial copies of the single-ended circuit 1370, with grounds of the copies 1370 connected to a common mode voltage vcm, which may be chosen as half of the minimum possible power supply voltage. A common-mode feedback circuit 1390 keeps the average of the two outputs constant at the vcm voltage.

Figure 1:
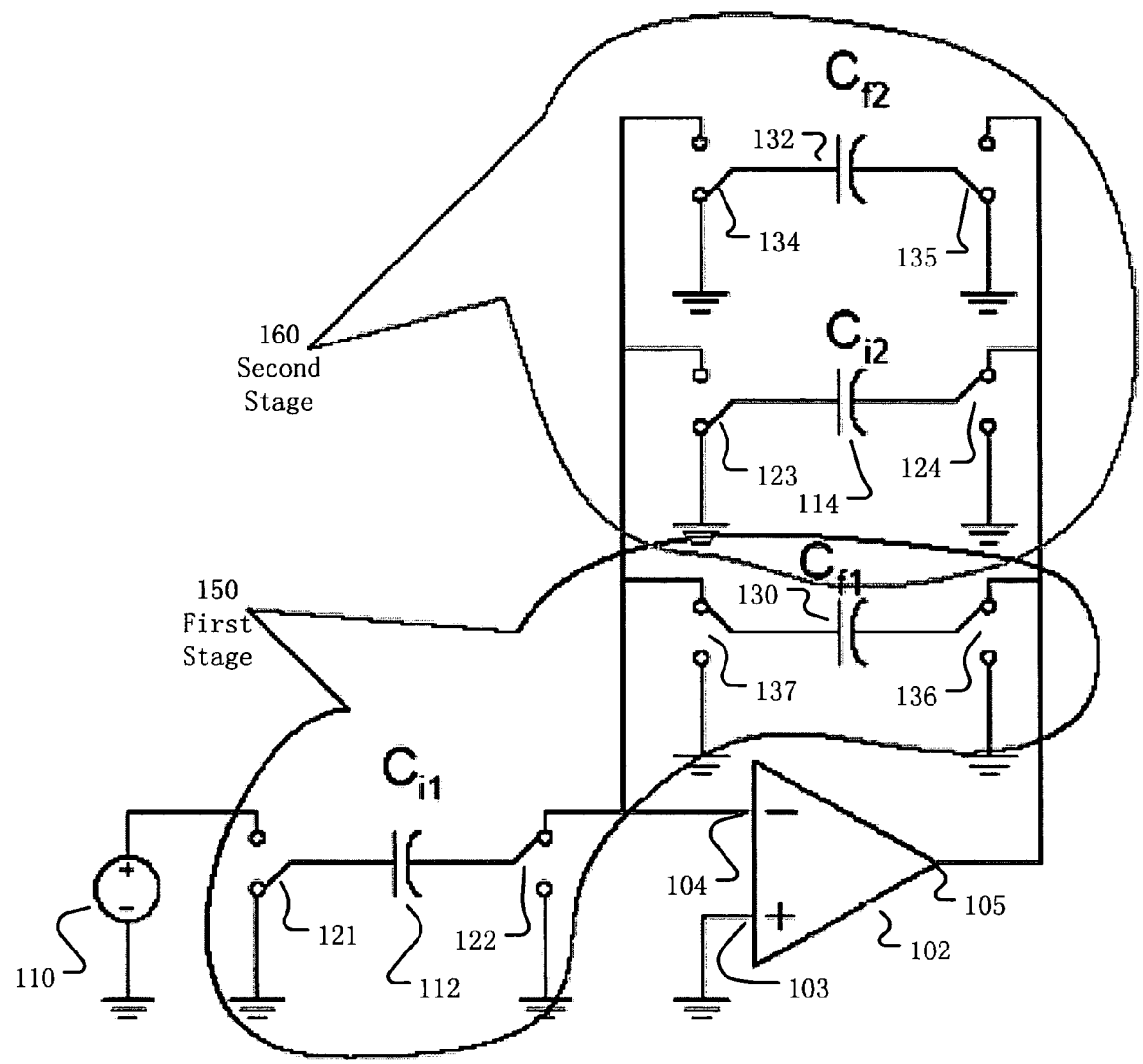
FIG. 1 is a diagram of a multi-stage amplifier circuit operating in the first stage.
Figure 2:
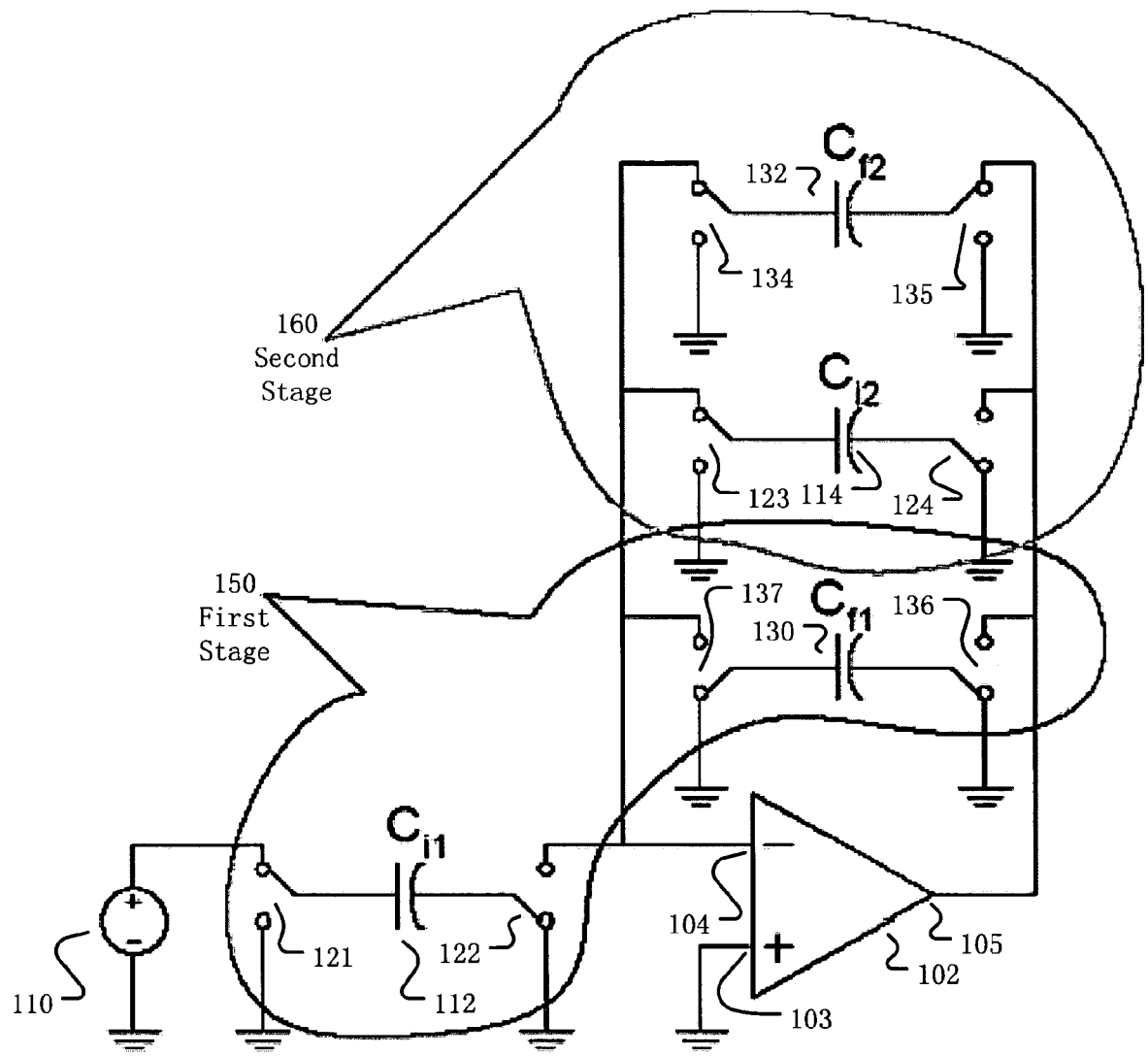
FIG. 2 is a diagram of a multi-stage amplifier circuit operating in the second stage.
Figure 3:
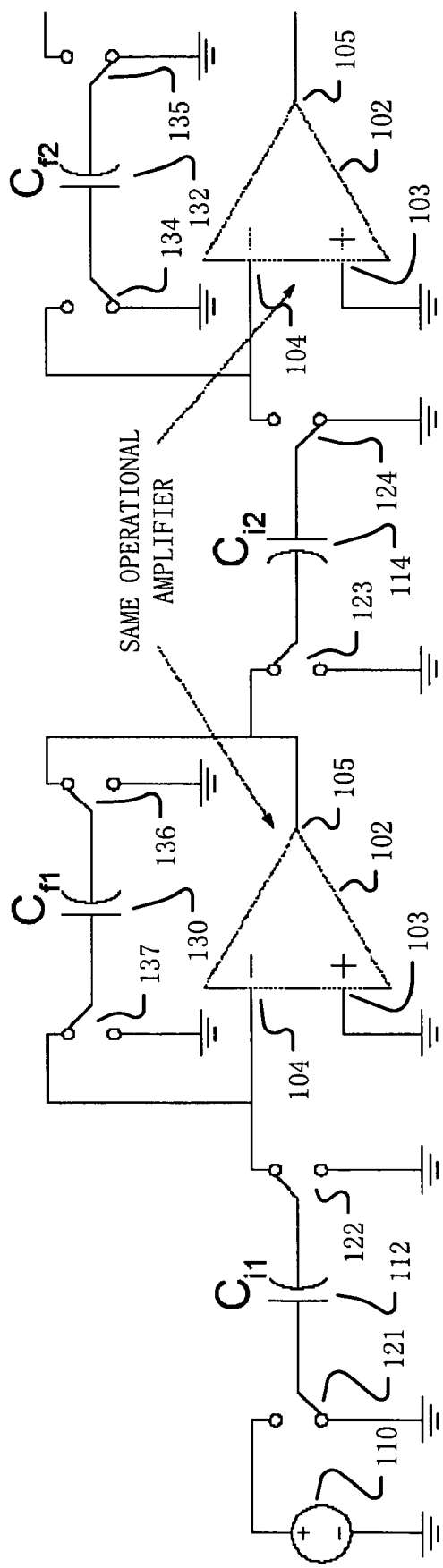
FIG. 3 is a diagram of the cascaded equivalent of the multi-stage amplifier circuit of FIG. 1 operating in the first stage.
Figure 4:
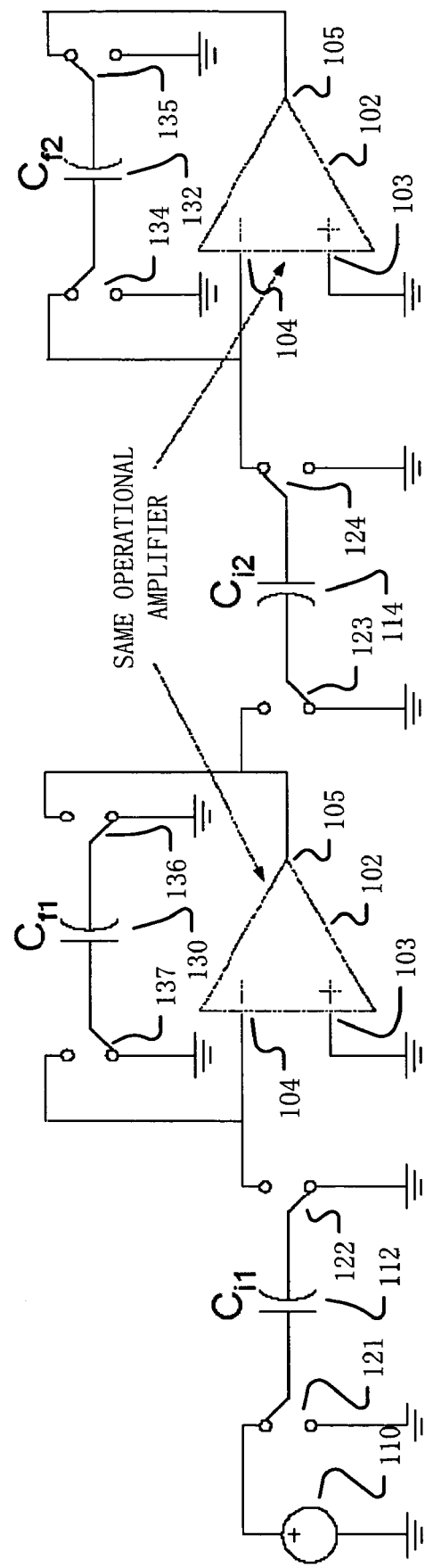
FIG. 4 is a diagram of the cascaded equivalent of the multi-stage amplifier circuit of FIG. 2 operating in the second stage.
Figure 5:
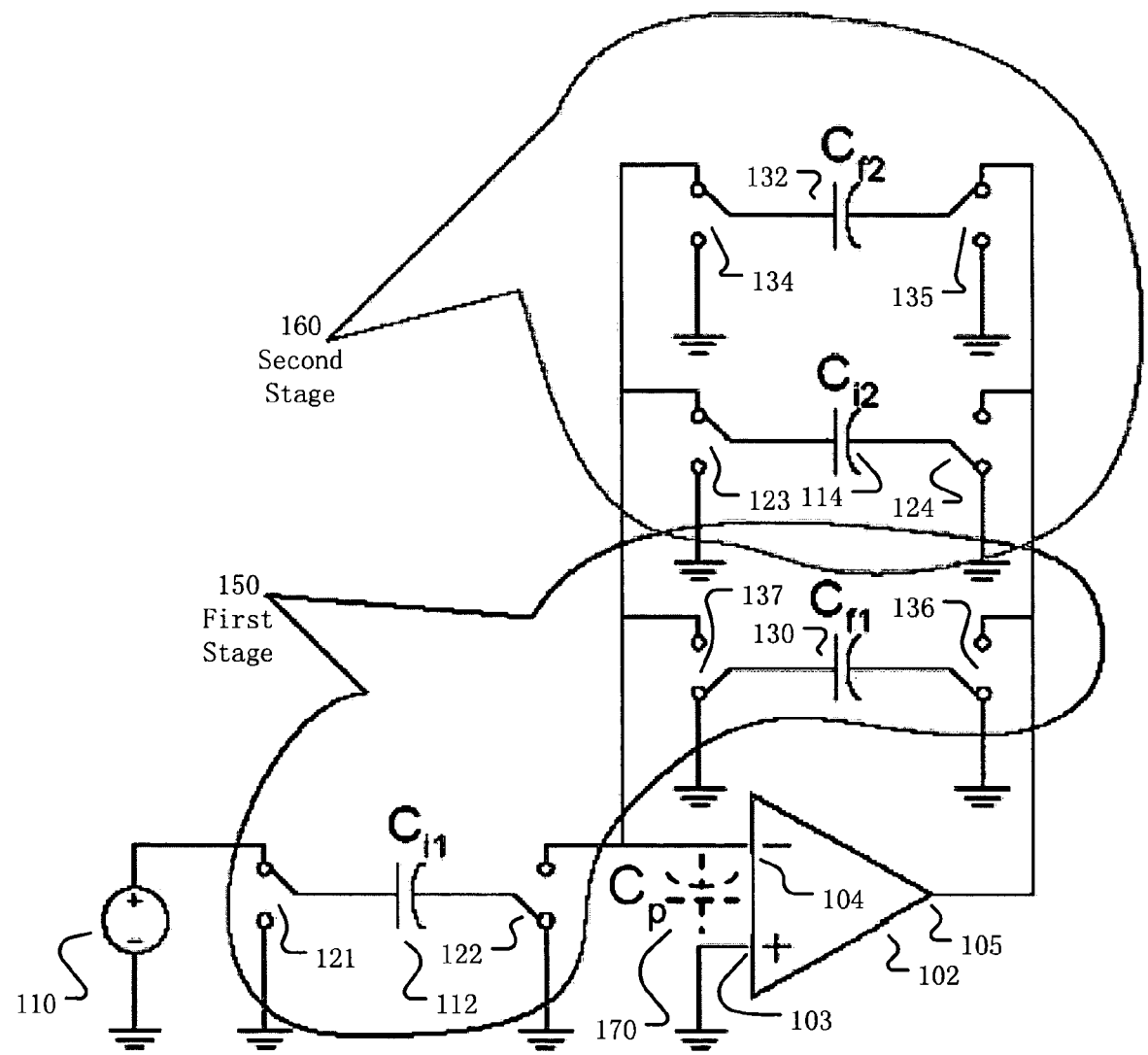
FIG. 5 is a diagram of the multi-stage amplifier circuit showing the parasitic capacitance across inputs of the operational amplifier.
Figure 14:
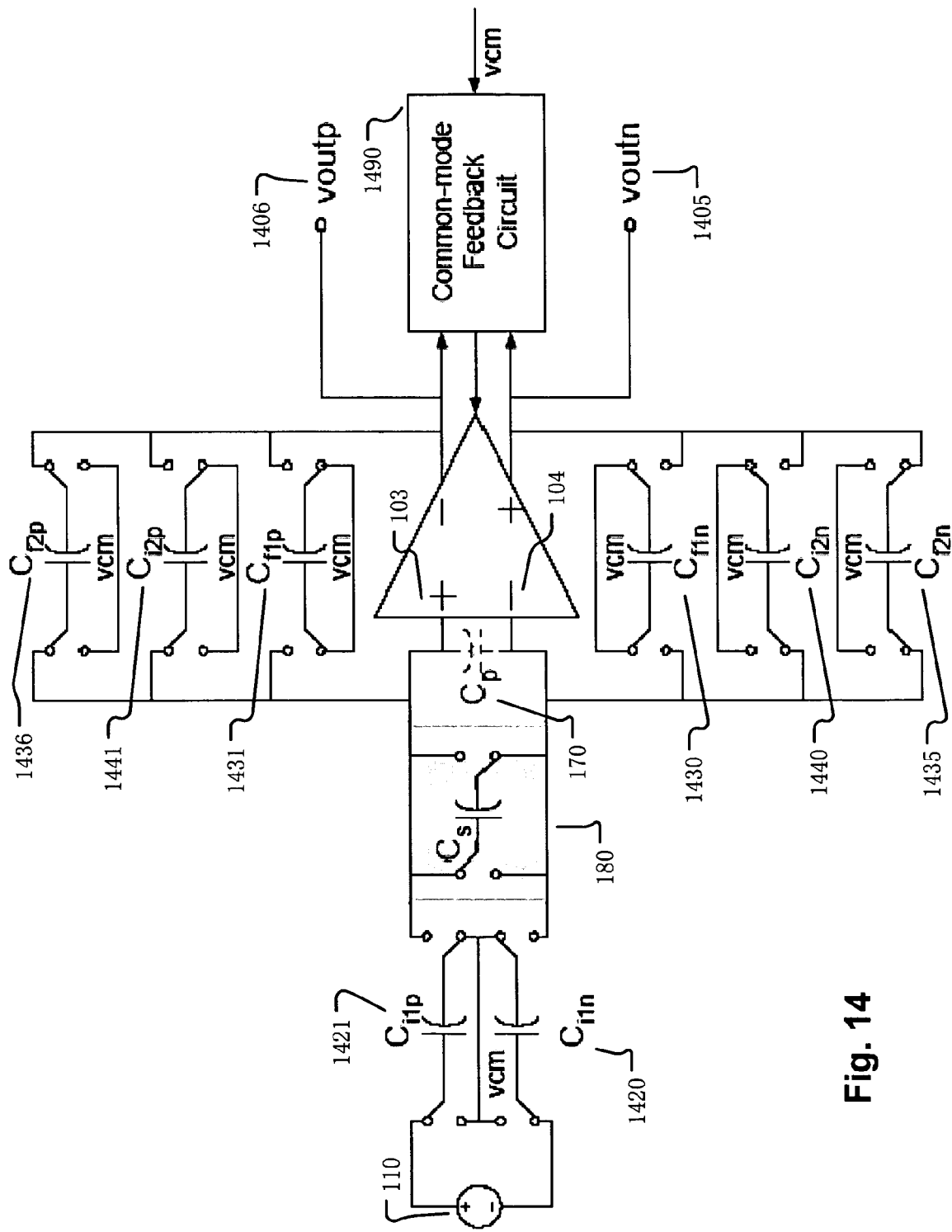
FIG. 14 shows differential implementation of the multi-stage amplifier circuit.

FIG. 14 shows differential implementation of the multi-stage amplifier circuit. FIG. 1 is a diagram of a multi-stage amplifier circuit operating in the first stage. The operational amplifier includes a grounded noninverting input 103, an inverting input 104, and outputs 1406 and 1405. The average of the outputs 1405 and 1406 is regulated to be constant at the vcm voltage by the common-mode feedback circuit 1490. During the first stage, the input signal for input capacitors $C_{i1p}$ 1421 and $C_{i1n}$ 1420 are provided respectively to the operational amplifier noninverting input 103 and the inverting input 104. Feedback is provided with feedback capacitor $C_{f1p}$ 1431 from the output 1406 to the noninverting input 103 and with feedback capacitor $C_{f1n}$ 1430 from the output 1405 to the inverting input 104. The output signals of the first stage of the amplifier circuit are stored on input capacitor $C_{i2p}$ 1441 from the operational amplifier output 1406 and on input capacitor $C_{i2n}$ 1440 from the operational amplifier output 1405.

During the first stage of the amplifier circuit, the output signals stored on input capacitors $C_{i2p}$ 1441 and $C_{i2n}$ 1440 are provided as input signals of the second stage of the amplifier circuit to the operational amplifier noninverting input 103 and inverting input 104 respectively. The input capacitors $C_{i1p}$ 1421 and $C_{i1n}$ 1420 store the input signal generated by the signal source 110. When the amplifier circuit subsequently operates in the first stage, the input signal stored by the input capacitors $C_{i1p}$ 1421 and $C_{i1n}$ 1420 will be provided to the operational amplifier noninverting input 103 and the inverting input 104. Feedback is provided with feedback capacitor $C_{f2p}$ 1436 from the output 1406 to the noninverting input 103 and with feedback capacitor $C_{f2n}$ 1435 from the output 1405 to the inverting input 104. The output signal at the operational amplifier outputs 1405 and 1406 during the second stage of the amplifier circuit, is the output signal of the differential amplifier circuit.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An amplifier circuit operating in at least a first stage and a second stage, comprising:
    an operational amplifier having two or more signal inputs and one or more signal outputs, the operational amplifier having feedback from at least one of the signal outputs to at least one of the signal inputs;
    first switching circuitry switching among multiple elements providing input for the operational amplifier, the first switching circuitry providing at least a first signal to one of the signal inputs of the operational amplifier for the first stage of the amplifier circuit and a second signal to one of the signal inputs of the operational amplifier for the second stage of the amplifier circuit;
    second switching circuitry switching among multiple elements providing feedback for the operational amplifier, the second switching circuitry providing at least a first capacitive value as the feedback of the operational amplifier for the first stage of the amplifier circuit and a second capacitive value as the feedback of the operational amplifier for the second stage of the amplifier circuit; and
    third switching circuitry substantially reducing parasitic charge at one or more of the signal inputs of the operational amplifier.

2. The amplifier circuit of claim 1, wherein the third switching circuitry substantially reduces parasitic charge by storing charge from one or more of the signal inputs of the operational amplifier for one of the first stage and the second stage of the amplifier circuit, and discharging the stored charge to the one or more of the signal inputs of the operational amplifier for the other of the first stage and the second stage of the amplifier circuit.

3. The amplifier circuit of claim 1, wherein the third switching circuitry substantially reduces parasitic charge by switching among polarities of a capacitance provided across two of the signal inputs of the operational amplifier, the third switching circuitry providing at least the capacitance with a first polarity across the signal inputs of the operational amplifier for the first stage of the amplifier circuit and the capacitance with a second polarity across the signal inputs of the operational amplifier for the second stage of the amplifier circuit.

4. The amplifier circuit of claim 1, wherein the first stage and the second stage operate at opposite phases of a clock signal.

5. The amplifier circuit of claim 1, wherein, the amplifier circuit receives a signal having an out-of-range value as input, resulting in saturation of an output signal provided by the amplifier circuit, and then about a clock cycle after the signal received as input no longer has the out-of-range value, the output signal substantially recovers from the saturation.

6. The amplifier circuit of claim 1, wherein the amplifier circuit is part of a programmable gain amplifier that processes data from an image sensor array, and
    wherein the amplifier circuit receives a signal having an out-of-range value as input, resulting in saturation of an output signal provided by the amplifier circuit, and then after the signal received as input no longer has the out-of-range value, about one pixel of data from the image sensor array is improperly processed by the amplifier circuit.

7. The amplifier circuit of claim 1, wherein the amplifier circuit is part of a digital to analog converter.

8. The amplifier circuit of claim 1, wherein the amplifier circuit is part of a programmable gain amplifier that processes data from an image sensor array.

9. The amplifier circuit of claim 1, wherein the signal inputs of the operational amplifier include an inverting input connected to the first switching circuitry, the second switching circuitry, and the third switching circuitry.

10. The amplifier circuit of claim 1, wherein the signal inputs of the operational amplifier include an inverting input;
    during the first stage of the amplifier circuit the inverting input is connected to the first signal of the first switching circuitry and the first capacitive value of the second switching circuitry; and
    during the second stage of the amplifier circuit the inverting input is connected to the second signal of the first switching circuitry and the second capacitive value of the second switching circuitry.

11. The amplifier circuit of claim 1, wherein the third switching circuitry substantially reduces parasitic charge by switching among polarities of a capacitance provided across two of the signal inputs of the operational amplifier, the third switching circuitry providing at least the capacitance with a first polarity across the signal inputs of the operational amplifier for the first stage of the amplifier circuit and the capacitance with a second polarity across the signal inputs of the operational amplifier for the second stage of the amplifier circuit;
    wherein the signal inputs of the operational amplifier include an inverting input;

during the first stage of the amplifier circuit the inverting input is connected to the first signal of the first switching circuitry, the first capacitive value of the second switching circuitry, and the capacitance of the third switching circuitry; and during the second stage of the amplifier circuit the inverting input is connected to the second signal of the first switching circuitry, the second capacitive value of the second switching circuitry, and the capacitance of the third switching circuitry.

12. The amplifier circuit of claim 1, wherein the first switching circuitry includes a capacitor receiving an output of the first stage of the amplifier circuit, and the capacitor of the first switching circuitry provides the second signal to one of the signal inputs of the operational amplifier for the second stage of the amplifier circuit.

13. The amplifier circuit of claim 1, wherein the amplifier circuit is differential.

14. The amplifier circuit of claim 1, wherein the multiple inputs include:

a plurality of first stage signal sources, wherein the first switching circuitry provides a plurality of first signals to said one of the signal inputs of the operational amplifier for the first stage of the amplifier circuit.

15. The amplifier circuit of claim 1, wherein the multiple inputs include:

a plurality of second stage signal sources, wherein the second switching circuitry provides a plurality of second signals to said one of the signal inputs of the operational amplifier for the second stage of the amplifier circuit.

16. A method of operating an amplifier circuit having at least a first stage and a second stage sharing an operational amplifier, the operational amplifier having two or more signal inputs and one or more signal outputs, the operational amplifier having feedback from at least one of the signal outputs to at least one of the signal inputs, comprising:

operating the first stage of the amplifier circuit, including:
providing a first signal to one of the signal inputs of the operational amplifier; and
providing a first capacitive value as the feedback of the operational amplifier;

operating the second stage of the amplifier circuit, including:
providing a second signal to one of the signal inputs of the operational amplifier; and
providing a second capacitive value as the feedback of the operational amplifier; and substantially reducing parasitic charge at one or more of the signal inputs of the operational amplifier.

17. The method of claim 16, wherein said substantially reducing parasitic charge includes:

during one of said operating the first stage of the amplifier circuit and said operating the second stage of the amplifier circuit, storing charge from one or more of the signal inputs of the operational amplifier; and during the other of said operating the first stage of the amplifier circuit and said operating the second stage of the amplifier circuit, discharging the stored charge to the one or more of the signal inputs of the operational amplifier.

18. The method of claim 16, wherein said substantially reducing parasitic charge includes:

providing a capacitance with a first polarity across the signal inputs of the operational amplifier, and
providing the capacitance with a second polarity across the signal inputs of the operational amplifier.

19. The method of claim 16, wherein the first stage and the second stage operate at opposite phases of a clock signal.

20. The method of claim 16, wherein, the amplifier circuit receives a signal having an out-of-range value as input, resulting in saturation of an output signal provided by the amplifier circuit, and then about a clock cycle after the signal received as input no longer has the out-of-range value, the output signal substantially recovers from the saturation.

21. The method of claim 16, wherein the amplifier circuit is part of a programmable gain amplifier that processes data from an image sensor array, and wherein the amplifier circuit receives a signal having an out-of-range value as input, resulting in saturation of an output signal provided by the amplifier circuit, and then after the signal received as input no longer has the out-of-range value, about one pixel of data from the image sensor array is improperly processed by the amplifier circuit.

22. The method of claim 16, wherein the amplifier circuit is part of a digital to analog converter.

23. The method of claim 16, wherein the amplifier circuit is part of a programmable gain amplifier that processes data from an image sensor array.

24. The method of claim 16, wherein the signal inputs of the operational amplifier include an inverting input connected to the first switching circuitry, the second switching circuitry, and the third switching circuitry.

25. The method of claim 16, wherein the signal inputs of the operational amplifier include an inverting input;

during the first stage of the amplifier circuit the inverting input is connected to the first signal and the first capacitive value; and during the second stage of the amplifier circuit the inverting input is connected to the second signal and the second capacitive value.

26. The method of claim 16, wherein said substantially reducing parasitic charge includes:

providing a capacitance with a first polarity across the signal inputs of the operational amplifier, and
providing the capacitance with a second polarity across the signal inputs of the operational amplifier; and
wherein the signal inputs of the operational amplifier include an inverting input;

during the first stage of the amplifier circuit the inverting input is connected to the first signal, the first capacitive value, and the capacitance; and during the second stage of the amplifier circuit the inverting input is connected to the second signal, the second capacitive value, and the capacitance.

27. The method of claim 16, wherein the first switching circuitry includes a capacitor receiving an output of the first stage of the amplifier circuit, and the capacitor of the first switching circuitry provides the second signal to one of the signal inputs of the operational amplifier for the second stage of the amplifier circuit.

28. The method of claim 16, wherein the amplifier circuit is operated differentially.

29. The method of claim 16, wherein said operating the first stage further includes:

providing at least one additional signal to said one of the signal inputs of the operational amplifier.

30. The method of claim 16, wherein said operating the second stage further includes:

providing at least one additional signal to said one of the signal inputs of the operational amplifier.

31. An image sensing and display device, comprising:
an amplifier circuit operating in at least a first stage and a second stage, including:
- an operational amplifier having two or more signal inputs and one or more signal outputs, the operational amplifier having feedback from at least one of the signal outputs to at least one of the signal inputs;
- first switching circuitry switching among multiple elements providing input for the operational amplifier, the first switching circuitry providing at least a first signal to one of the signal inputs of the operational amplifier for the first stage of the amplifier circuit and a second signal to one of the signal inputs of the operational amplifier for the second stage of the amplifier circuit;
- second switching circuitry switching among multiple elements providing the feedback for the operational amplifier, the second switching circuitry providing at least a first capacitive value as the feedback of the operational amplifier for the first stage of the amplifier circuit and a second capacitive value as the feedback of the operational amplifier for the second stage of the amplifier circuit; and
- third switching circuitry substantially reducing parasitic charge at one or more of the signal inputs of the operational amplifier;

an image sensor array providing image data to the amplifier circuit;
an analog to digital converter receiving amplified image data from the amplifier circuit;
image processing circuitry coupled to the analog to digital converter; and
a display coupled to the image processing circuitry.

32. The device of claim 31, wherein the image sensing and display device is a camera.

33. The device of claim 31, wherein the image sensing and display device is a phone.

34. The device of claim 31, wherein the image sensing and display device is a computer.

* * * * *